United States Patent [19]

Pohlmann

[11] Patent Number: 4,884,715
[45] Date of Patent: Dec. 5, 1989

[54] HOUSING FOR ELECTRICAL AND ELECTRONIC COMPONENTS

[75] Inventor: Franz Pohlmann, Minden, Fed. Rep. of Germany

[73] Assignee: Rose Elektrotechnik GmgH & Co. K.G., Porta Westfalica, Fed. Rep. of Germany

[21] Appl. No.: 255,246

[22] Filed: Oct. 11, 1988

[30] Foreign Application Priority Data

Oct. 13, 1987 [DE] Fed. Rep. of Germany ....... 3734564

[51] Int. Cl.4 .............................................. H05K 5/02
[52] U.S. Cl. ......................................... 220/76; 220/80
[58] Field of Search ..................... 220/76, 75, 80, 4 R, 220/4 A, 76, 80

[56] References Cited

U.S. PATENT DOCUMENTS

| | | | |
|---|---|---|---|
| 1,316,968 | 9/1919 | Neill et al. | 220/75 |
| 1,605,597 | 11/1926 | Long | 220/75 X |
| 1,796,024 | 3/1931 | Hohler | 220/76 X |
| 2,028,058 | 1/1936 | Geyer | 220/80 |
| 2,489,670 | 11/1949 | Powell, Jr. | 220/76 X |
| 2,822,110 | 2/1958 | Wile | 220/80 |
| 3,450,293 | 6/1969 | Seda et al. | 220/80 X |
| 4,111,328 | 9/1978 | Eggert et al. | 220/4 R |

FOREIGN PATENT DOCUMENTS 8708608 10/1987 Fed. Rep. of Germany .

Primary Examiner—Steven M. Pollard
Attorney, Agent, or Firm—William A. Drucker

[57] ABSTRACT

A housing for electrical and electronic components includes several flat-shaped wall panels held together by specially shaped corner joints. The corner joints are formed from simply assembled, economically manufactured sections designed for different sized housing, and provide a simple, secure and tight connection of the housing wall panels which cannot be seen form the housing exterior. The corner joints comprise two interlocking extruded sections, one of which can simply be fixed to an adjoining wall panel as a connecting section and the other is a cover section which can quickly and securely be fixed to the connecting section. The cover section has a rounded corner which blends smoothly into the wall panels. The fixing of the inner connecting section is achieved in an sturdy manner by screws and the external cover section fits conveniently and easily onto the connecting section. This housing, besides being a simple and sturdy construction, offers the advantage of flap packing for despatch.

3 Claims, 2 Drawing Sheets

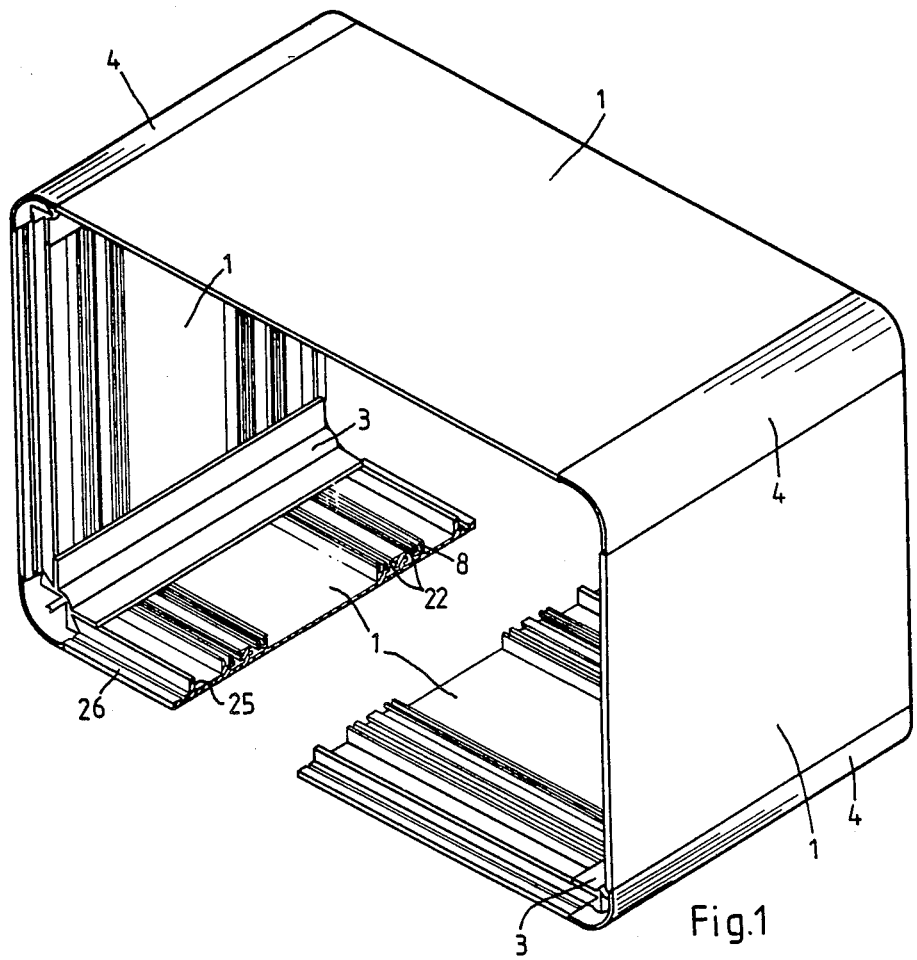
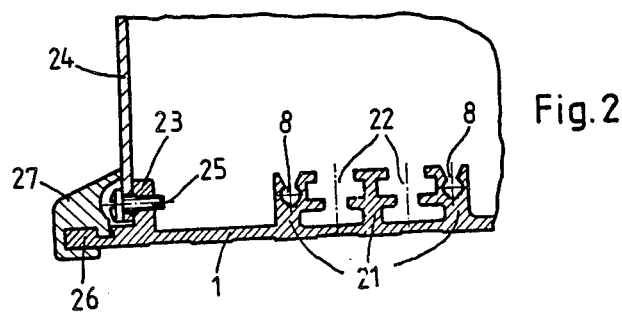

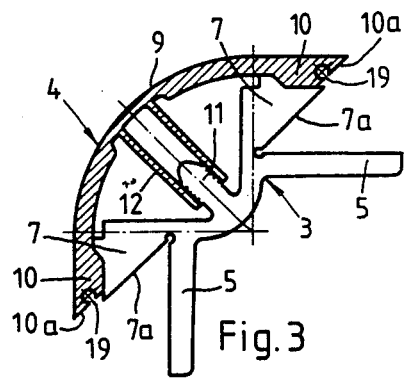
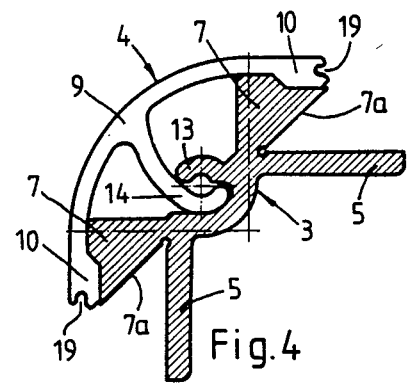
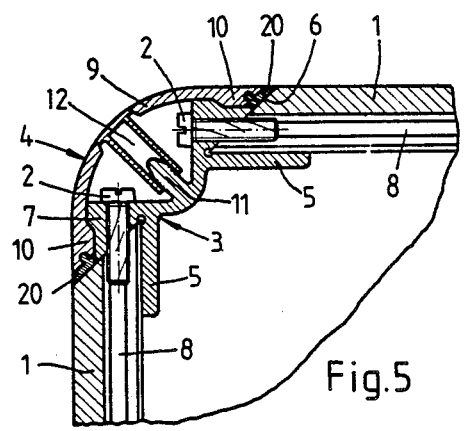
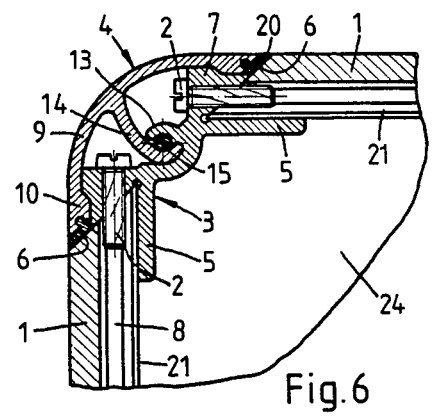
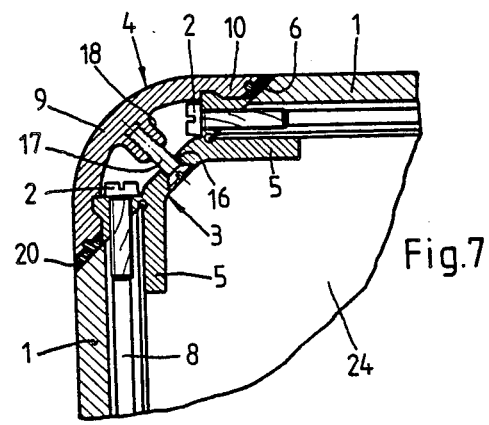

HOUSING FOR ELECTRICAL AND ELECTRONIC COMPONENTS

FIELD OF THE INVENTION

This invention relates to a housing capable of receiving a wide variety of electrical and electronic components.

DESCRIPTION OF THE PRIOR ART

A housing is known from German Registered Design 87 08 608 which includes several flat-shaped wall panels held together by corner joints. In this Design Registration, the corner joints are formed from grooved sections, these being attached to the wall panels by wedge screw fixings.

SUMMARY OF THE INVENTION

Starting from the housing disclosed by German Registered Design 87 08 608, one object of the present invention is to provide a housing whose corner joints are constructed from simply assembled sections; are economical to manufacture; are designed for different sized housings; provide simple, secure, tight connections to the housing wall panels; and cannot be seen from the outside.

According to the present invention, there is provided a housing for electrical and electronic components which includes several flat-shaped wall panels secured together by corner joints, each corner joint being formed from an internal retaining section secured by screws or the like to two adjacent wall panels, and an external cover section which is secured to the retaining section.

For connecting the wall panels of the housing, corner joints are provided which comprise at any time two interlocking extruded sections, of which one section is attachable in a simple manner to the wall panel as a connecting section and the other section as the cover section can be attached to the connecting section simply, quickly and securely. This cover section produces a rounded, externally smooth corner fitting overlapping the wall panels.

The inner connecting section (retaining section) is fixed permanently by screws and the outer cover section with a seal is fitted easily and conveniently to the retaining section by means of plugs, hooks or screws.

Due to the construction of both sections as extruded profile sections, they can be cut off to the desired length and thus be used for the different sizes of housing.

This corner joint is sturdy and tight. Compared with housings made of one piece, this construction offers advantages for despatch as a so-called "Flat Pack".

BRIEF DESCRIPTION OF THE DRAWINGS

The invention will now be described, by way of example only, with reference to the accompanying drawings in which:

FIG. 1 is a perspective view of a housing in accordance with the invention formed from flat-shaped wall panels and contoured corner joints;

FIG. 2 is a cross-section through part of a wall panel of the housing illustrated in FIG. 1 with a front wall and sealing section of the housing held in position;

FIGS. 3 and 4 are cross-sections taken through two different designs of corner joints of housings in accordance with the invention, each design consisting of a retaining section and a cover section;

FIGS. 5 and 6 respectively are cross-sections taken through the corner joints illustrated in FIGS. 3 and 4, each corner joint being shown in position with two adjacent walls; and FIG. 7 is a cross-section taken through an alternative corner joint of a housing in accordance with the invention, the corner joint bein shown fixed to two adjacent wall panels of the housing.

DESCRIPTION OF PREFERRED EMBODIMENTS OF THE INVENTION

As illustrated a housing in accordance with the invention includes four flat-shaped wall panels (1) held together by corner joints. Each corner joint includes an inner retaining section (3) fastened by screws (2) or the like to the two adjoining wall panels (1) and an outer cover section (4) fixed to the retaining section (3).

Each cover section (4) is detachably connected to the respective retaining section (3) by plugs, catches, hooks or screws.

Each retaining section (3) has two locating strips (5) set at right angles to one another on which seat two adjoining wall panels (1) of the housing; the connection between the adjoining wall panels (1) including the cover section (4), extends into the vertex of the angle between the two locating strips (5).

Each locating strip (5) has a fixing strip (7) lying in front of a mitred front edge (6) of each wall panel (1). Several screws are driven into the inner section (8) of the wall panel (1) to secure the retaining section (3) to the two wall panels (1) which lie at right angles to one another.

In cross-section, the cover section (4) is profiled to define a quarter circle (9) with, at each end, a sealing strip (10) which overlaps the fixing strips (7) of the retaining section (3). The sealing strip (10) runs parallel to and flush with the outside of the wall panel (1) concerned.

Referring now to FIGS. 3 and 5, moulded onto each retaining section (3) in the vertex of its angle is a connecting strip (11). The strip (11) includes one or more diagonally outwardly protruding teeth onto which a hollow plug-in socket strip (12) moulded onto the inside surface of each cover section (4) is located. Once fitted, the cover section (4) is held securely.

In an alternative unillustrated embodiment, the toothed connecting strip (11) is formed on the inside of the cover section (4), each hollow plug-in socket strip (12) then being carried by the respective retaining section (3).

The socket strip (12) is located at the median line of the angle of the quarter circle (9) and runs diagonally towards the cover section (3).

In the arrangement illustrated in FIGS. 4 and 6, a curved hook-type strip (13) is provided on each retaining section (3) in the region of the vertex of the respective angle, behind which a hook-type strip (14) moulded on the inside of cover section (4) engages; between the interlocking hooks of the hooked strips (13, 14) a fixing bolt (15) in rod or screw form is inserted. The bolt (15) braces the two hooked strips (13, 14) against each other and fixes them together.

In the arrangement illustrated in FIG. 7, a third type of connection is shown, in which a drill-hole (16) is made at the vertex of the angle of retaining section (3). A screw (17) is introduced in the hole (16) and is screwed into a threaded strip (18) in the form of a toothed screw-channel moulded on the inside of the quarter circle (9) and diagonally protruding towards retaining section (3).

The fixing strips (7) of each retaining section (3) have mitred surfaces (7a) which complement to the front edges (6) of the wall panels (1), and which, with the respective locating strip (5), define an acute angle.

The free ends of the sealing strips (10) of the cover sections (4) are also provided with bevelled surfaces (10a) which correspond to the mitred surfaces (6) of the wall panels (1).

Between each fixing strip (10) and the bevelled edge (6) of the respective wall panel (1), a seal (20) is located within a groove (19) formed in the fixing strip (10). The seal (20) seals the outer zone between the respective wall panel (1) and the cover section (4). The cover section (4) is manufactured from a light alloy or plastics material as an extruded section.

The retaining section (3) is manufactured from light alloy as an extruded section.

The wall panels (1) are provided on their inside surfaces with moulded section strips (21). These strips (21) are formed with screw channels (8) and assembly grooves (22) to receive electrical and electronic components.

The screw channels (8) are also used to locate the screws (2) for fixing the retaining sections (3).

Moulded along the two longer edges of the wall panel (1) are locating fins (23), against which a front or rear wall panel (24) can be located and fixed by means of screw fastenings (25). The screw fastenings (25) are covered on the outside (see FIG. 2) by a removable sealing section (27) clipped onto a retaining section (26) moulded onto each wall panel (1).

To assemble the housing, firstly the wall panels (1) are placed against the locating strips (5) of the internal retaining sections (3). The wall panels (1) are then secured to the retaining sections (3) by the screws (2). The respective cover section (4) is then fixed onto its retaining section (3) by the plug, hook or screw connection (11, 12/13, 14/17, 18), with the two end sealing strips (10) overlapping the fixing strips (7).

The housing has rounded corners by means of the quarter circle (9).

After assembly of electrical or electronic components into the housing, the front and rear wall panels (24) are fixed to the locating fins (23) by screws (25), so that the housing is fully enclosed. Then the sealing sections (27) are clipped onto the retaining section (26), so that the screws (25) are covered and cannot be seen from the outside.

I claim:

1. A housing for electrical and electronic components which includes several flat-shaped wall panels secured together by corner joints, each corner joint being formed from an internal retaining section including two wall panel locating strips which lie at right angles to one another, a fixing strip, for each locating strip, which lies in front of a mitred front edge of one of the several wall panels, the fixing strip and adjoining wall panel having securing screws passing therethrough from the mitred edge into the inner section of the wall panel to secure the fixing strip to the respective wall panel, and an external cover section secured to the respective retaining section, the junction point for the said cover section lying within the vertex of the angle defined between the locating strips of the retaining section.

2. A housing according to claim 1 wherein each cover section includes sealing strips which overlap the fixing strips of the retaining section and run parallel to and flush with the outside of the respective wall panel, the fixing strrips of each retaining section and the sealing strips of each cover section being provided with bevelled surfaces which complement the mitred edges of the wall panels.

3. A housing according to claim 2 wherein between each sealing strip and the mitred edge of the adjoining wall panel is fitted a seal retained in a groove in the sealing strip.

* * * * *